(12) United States Patent
Choy et al.

(10) Patent No.: US 7,784,306 B1
(45) Date of Patent: Aug. 31, 2010

(54) MATERIAL DEPOSITION

(75) Inventors: Kwang-Leong Choy, Coventry (GB); Issac Tsz Hong Chang, Coventry (GB)

(73) Assignee: Innovative Materials Processing Technologies Limited, London (GB)

( * ) Notice: Subject to any disclaimer, the term of this patent is extended or adjusted under 35 U.S.C. 154(b) by 1393 days.

(21) Appl. No.: 09/555,544

(22) PCT Filed: Dec. 7, 1998

(86) PCT No.: PCT/GB98/03636

§ 371 (c)(1),
(2), (4) Date: Aug. 1, 2000

(87) PCT Pub. No.: WO99/29917

PCT Pub. Date: Jun. 17, 1999

(30) Foreign Application Priority Data

Dec. 5, 1997 (GB) .................................. 9725878.4

(51) Int. Cl.
*C03B 8/02* (2006.01)
(52) U.S. Cl. ........................... 65/17.2; 65/413; 65/414; 65/17.4; 427/193; 427/472; 427/567
(58) Field of Classification Search ................. 65/17.2, 65/17.3, 17.4, 17.5, 17.6, 413, 414, 386, 65/397, 425; 427/193, 427, 468, 469, 472, 427/473, 474, 477, 547, 550, 567, 598
See application file for complete search history.

(56) References Cited

U.S. PATENT DOCUMENTS

| | | | | |
|---|---|---|---|---|
| 4,934,595 A | * | 6/1990 | Reimer ........................... 239/8 |
| 5,211,990 A | * | 5/1993 | McKinney et al. ........... 427/447 |
| 5,213,598 A | * | 5/1993 | Silingardi et al. ............. 65/17.4 |
| 5,599,371 A | * | 2/1997 | Cain et al. .................... 65/17.4 |
| 5,702,495 A | * | 12/1997 | Hiraiwa et al. ................ 65/17.1 |
| 5,788,730 A | * | 8/1998 | Ruppert et al. ................ 65/17.4 |
| 5,979,185 A | * | 11/1999 | Blackwell et al. ............. 65/17.4 |
| 6,312,656 B1 | * | 11/2001 | Blackwell et al. ............ 423/337 |
| 6,363,746 B1 | * | 4/2002 | Wei et al. ...................... 65/17.4 |
| 6,374,642 B1 | * | 4/2002 | Blackwell et al. .............. 65/414 |
| 2001/0032482 A1 | * | 10/2001 | Hawtof ......................... 65/17.4 |

FOREIGN PATENT DOCUMENTS

JP 56005337 1/1981

(Continued)

OTHER PUBLICATIONS

Translation of MASAHIDE JP-64-65040 of Mar. 10, 1989.*

*Primary Examiner*—John Hoffmann
(74) *Attorney, Agent, or Firm*—Frommer Lawrence & Haug LLP

(57) ABSTRACT

An apparatus for and method of depositing material on a substrate, the method comprising the steps of: delivering from a first outlet a stream of droplets of a precursor liquid towards a substrate; applying an electric field between the first outlet and the substrate; and delivering from a second outlet a flow of fuel about the stream of droplets such as to provide an annular flame combustion region between the first outlet and the substrate through which at least a portion of the stream of droplets passes before reaching the substrate, whereby the precursor liquid is one or both of chemically reacted and decomposed to provide the deposited material.

28 Claims, 1 Drawing Sheet

Figure 1:
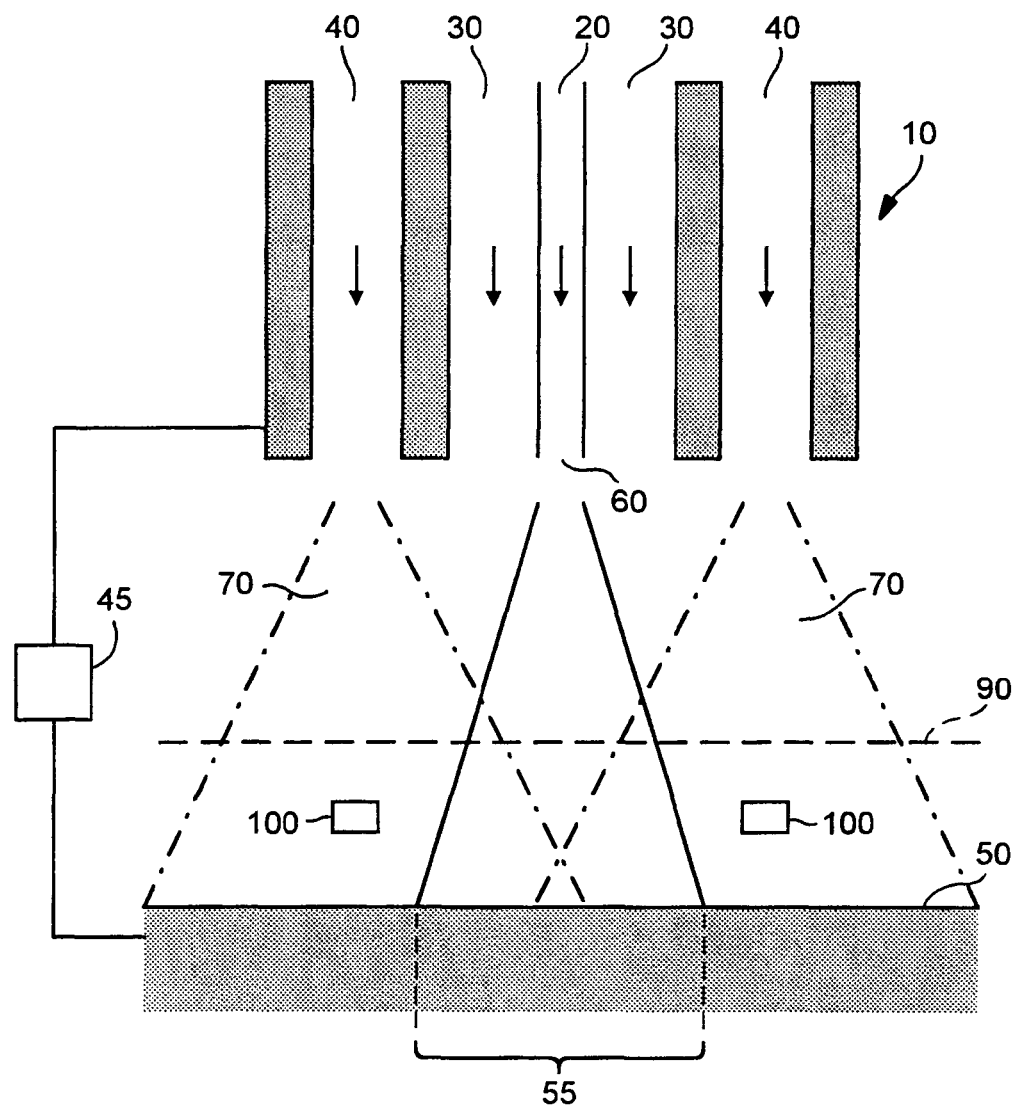

| | FOREIGN PATENT DOCUMENTS | | JP | 09235131 | 9/1997 |
|---|---|---|---|---|---|
| JP | 57067038 | 4/1982 | WO | WO 97/21848 | 6/1997 |
| JP | 01065040 | 3/1989 | | | |
| JP | 02055241 | 2/1990 | * cited by examiner | | |

MATERIAL DEPOSITION

This invention relates to material deposition, for example, as a film or layer on a substrate or as a powder.

The application of materials such as ceramics as structural coatings and functional electronic films is expanding rapidly. Various deposition techniques such as chemical vapour deposition (CVD), physical vapour deposition (PVD), flame synthesis deposition (FSD), combustion chemical vapour deposition (CCVD) and sol-gel deposition have been developed or investigated.

Both CVD and PVD techniques involve the use of sophisticated and expensive deposition chambers and/or vacuum systems. The application of CVD and PVD techniques to deposit ceramic films is limited to coating processes in which the film thicknesses and coating areas are relatively small.

It is often difficult to control the stoichiometry of multi-component oxide films deposited by CVD techniques, and problems can also arise due to differences in the vapour pressures of the CVD reagents and the low growth rate of CVD films.

PVD techniques such as radio frequency (RF) sputtering tend to give low deposition rates and poor yields, and reactive magnetic sputtering and ion beam sputtering need expensive equipment and skilled operators.

FSD techniques produce films with a morphology, microstructure and electrical properties which are dependent on the temperature of the substrate, the coating concentration, the carrier gas flow rate and so on. Control of all of these variables to achieve a desired coating is difficult.

Reference is also made to Hunt et al, Applied Physics 63 (1993), No 2, pages 266 to 268, WO-A-97/21848, GB-A-2192901, GB-A-2162861, EP-A-0103505, U.S. Pat. No. 5,652,021, U.S. Pat. No. 5,534,311 and SE-A-9504410.

This invention addresses these problems by providing a deposition technique which at least alleviates some of the disadvantages of the prior art.

This invention provides a method of depositing material on a substrate, comprising the steps of: delivering from an outlet a stream of droplets of a precursor liquid towards a substrate; applying an electric field between the outlet and the substrate; and generating a flame between the outlet and the substrate such that at least a portion of the stream of droplets of the precursor liquid passes through the flame before reaching the substrate and the precursor liquid is chemically reacted and/or decomposed to provide the deposited material.

This invention also provides an apparatus for depositing material on a substrate, comprising: a substrate holder for holding a substrate; a nozzle assembly including an outlet from which a stream of droplets of a precursor liquid is in use delivered to a substrate; a precursor supply for supplying a precursor liquid to the nozzle assembly; an electrical supply for applying an electric field between the outlet and the substrate; and a burner for generating a flame between the outlet and the substrate and being configured such that in use at least a portion of the stream of droplets of the precursor liquid passes through the flame before reaching the substrate and the precursor liquid is chemically reacted and/or decomposed to provide the deposited material.

In a preferred embodiment the material is a ceramic material.

This invention provides a new technique which, in at least preferred embodiments, involves spraying atomised precursor droplets into a flame while providing an electric field between the precursor outlet and the substrate, so that the precursor forms a charged aerosol which undergoes combustion and/or chemical reaction in the vapour phase in the vicinity of the substrate and allows for the formation of a stable solid film with good adhesion to the substrate.

This invention will now be described, by way of example only, with reference to the accompanying drawings, throughout which like parts are described by like references, and in which FIG. 1 is a schematic diagram of a deposition apparatus.

FIG. 1 schematically illustrates a deposition apparatus comprising a coaxial nozzle assembly 10 having a liquid precursor delivery capillary 20, a first coaxial passage 30 for cold air, nitrogen or other gases, and a second coaxial passage 40 for liquid or gaseous fuel.

The precursor can be, for example, one of the precursors listed in WO-A-97/21848, with or without the mentioned catalyst. Many other precursors can be used as appropriate for the desired deposition, such as precursors known from FSD techniques as disclosed by Choy in "Flame Assisted Vapour Deposition of Ceramic Films and Coatings", British Ceramic Proceedings, The Institute of Materials (1995), pages 65 to 74.

The fuel may be a mixture of oxygen and acetylene, or another appropriate fuel, such as fuels known from FSD techniques.

A high voltage source 45 maintains an electric field between the nozzle assembly 10 and a substrate 50. The potential difference may be, for example, within the approximate ranges described in WO-A-97/21848, typically in the approximate range of from 5 to 30 kV.

The precursor liquid is sprayed towards a region 55 of the substrate 50 from an outlet 60 of the capillary 20. The fuel is ignited so that an annular combustion region 70 is generated. The extent of this combustion region can be controlled by controlling the fuel flow rate, the distance between the nozzle assembly 10 and the substrate 50, the amount and flow rate of cold gases in the passage 30, and the applied electric field.

Decomposition and/or chemical reaction of the precursor, for example, a sol-gel transition, occurs in a higher temperature overlap zone between the spray of precursor from the outlet 60 of the capillary 20 and the combustion region 70. Deposition occurs in or beneath this overlap zone. So, by controlling the extent of the combustion region as described above, the deposition on the substrate 50 can be controlled, and premature reaction or decomposition, which is a problem in many prior art FSD techniques leading to non-uniform deposition, can be avoided.

Either polarity of electric field can be used, or a periodically or occasionally alternating field can be employed. A thermocouple can be used to monitor the temperature of the substrate 50.

The apparatus preferably includes a mesh 90 which assists in removing soot from the flame and so provide a high temperature (blue) flame.

The apparatus preferably includes a further annular electrode 100 connected to the high voltage supply 45 at an intermediate potential between that of the nozzle assembly 10 and the substrate 50 to steer the material being deposited onto a required area of the substrate 50.

The technique is also applicable to premixed fuel and precursor systems. However, non-premixed systems are preferred as these systems give greater control of the deposition temperature and assist in avoiding premature decomposition.

The technique can be used to manufacture metal oxide and non-oxide materials; to manufacture pure, doped, multicomponent or multiphase materials; to manufacture materials with dense, porous, or a combination of dense and porous structures; to manufacture composite, multilayer and compositionally-graded structures; to produce thin or thick films; for rapid prototyping of net shape and near net shape components; or to coat planar or tubular substrates or other complex shaped components.

The technique can be scaled up for large area or mass production by using multiple flame/electrostatic units. For accurate deposition and process control, the process can be automated.

The substrate 50 can be conductive or non-conductive. For non-conductive substrates, the conductivity can be improved by utilizing a conductive backing holder.

The technique can be performed in an open atmosphere or in an inert/controlled atmosphere. For example, oxide-based structures can be deposited in an open atmosphere, and non-oxide structures, such as sulphides, carbides, etc, can be deposited in a controlled atmosphere. Deposition can take place at atmospheric or a different pressure.

The chemistry of the precursors can be adjusted so that once the chemical reaction starts to take place, a self-assisted reaction occurs. This can reduce the requirements for fuel, while still achieving the required deposition temperature for a particular material.

The electric field reduces the loss of precursor to the surroundings by directing the precursor to the deposition surface. This is a clear advantage over conventional flame-based techniques.

The deposition can be controlled by one or more of the following: the flow rate of the cold gas; the electric field strength; the fuel and its flow rate; the separation of the nozzle assembly from the substrate; the chemistry, concentration and flow rate of the precursor; and the deposition pressure.

Embodiments of the invention allow the use of simple, flexible and/or mobile equipment. The technique can be made relatively safe by the use of sol precursors and/or water based precursors. The process can give rise to an advantageously low flame/deposition temperature for crystalline materials, for example from 550 to 800° C. for $Y_2O_3$—$ZrO_2$. Dense films tend to require a sol precursor, whereas porous films may be based on sol or water based precursors. The consumption of precursor can be relatively low, for example, 1 ml of 0.05 M solution to generate a 1 µm film measuring 1 cm×1 cm. Furthermore, the deposition can be performed in a single step without the need for a subsequent heat treatment.

Powders can be formed by providing for the chemical reaction of the precursor to the solid phase to take place above the substrate 50. With this configuration, the substrate 50 is deposited with discrete powder particles which can be later collected. Powder generation can be improved by employing gas condensation techniques and a cooled collecting substrate.

In a further embodiment, the substrate 50 can be mounted on a movable table or XY positioner under the control of for example, a computer aided design (CAD) system to allow three-dimensional objects to be constructed layer by layer. This can be used in, for example, rapid prototyping systems.

The invention claimed is:

1. A method of depositing material on a substrate, comprising the steps of:
   delivering from a first outlet a stream of droplets of a precursor liquid towards a substrate;
   applying an electric field between the first outlet and the substrate; and
   delivering from a second outlet a flow of fuel about the stream of droplets such as to provide an annular flame combustion region between the first outlet and the substrate through which at least a portion of the stream of droplets passes before reaching the substrate, whereby the precursor liquid is chemically reacted, or decomposed, or chemically reacted and decomposed, to provide the deposited material.

2. The method according to claim 1, wherein the chemical reaction, or the decomposition, or the chemical reaction and decomposition, occurs in a higher temperature overlap zone between the stream of droplets and the annular flame combustion region.

3. The method according to claim 1, wherein the flow of fuel is a diverging flow.

4. The method according to claim 1, wherein the first and second outlets are coaxial.

5. The method according to claim 1, wherein the stream of droplets is provided as a diverging spray.

6. The method according to claim 1, further comprising the step of:
   delivering a flow of cold gas in a direction from the first outlet towards the substrate.

7. The method according to claim 1, wherein the flow of cold gas is delivered from a third outlet as a flow about the stream of droplets and within the flow of fuel.

8. The method according to claim 1, wherein the first and third outlets are coaxial.

9. The method according to claim 1, wherein the material is a ceramic material.

10. The method according to claim 1, wherein the material is a multicomponent oxide material.

11. The method according to claim 1, further comprising the step of:
    heating the substrate.

12. The method according to claim 1, wherein the precursor liquid is a sol precursor solution.

13. The method according to claim 1, further comprising the step of:
    moving one or both of the substrate and the first outlet during deposition so as to deposit a three-dimensional structure as a series of overlying layers.

14. The method according to claim 1, further comprising the step of:
    controlling a region of deposition by varying one or more of a rate of flow of the fuel, a separation between the first outlet and the substrate and the electric field between the first outlet and the substrate.

15. The method according to claim 1, wherein the material is deposited as a powder and the chemical reaction, or the decomposition, or the chemical reaction and decomposition, occurs away from the substrate.

16. The method according to claim 1, wherein the material is deposited as a solid film and the chemical reaction, or the decomposition, or the chemical reaction and decomposition, occurs in the vicinity of the substrate.

17. An apparatus for depositing material on a substrate, comprising:
    a nozzle assembly including a first outlet from which a stream of droplets of a precursor liquid is in use delivered to a substrate, and a second outlet from which a flow of fuel is in use delivered such as to provide an annular flame combustion region through which at least a portion of the stream of droplets in use passes before reaching the substrate;
    a precursor supply for supplying a precursor liquid to the nozzle assembly;
    an electrical supply for applying an electric field between the first outlet and the substrate; and
    a burner for generating the flame of the annular flame combustion region between the first outlet and the substrate;

whereby the precursor liquid is chemically reacted, or decomposed, or chemically reacted and decomposed, in the annular flame combustion region to provide the deposited material.

18. The apparatus according to claim 17, wherein the chemical reaction, or the decomposition, or the chemical reaction and decomposition, occurs in a higher temperature overlap zone between the stream of droplets and the annular flame combustion region.

19. The apparatus according to claim 17, wherein the first and second outlets are coaxial.

20. The apparatus according to claim 17, wherein the nozzle assembly further comprises a third outlet disposed between the first and second outlets from which a flow of cold gas is in use delivered.

21. The apparatus according to claim 20, wherein the first and third outlets are coaxial.

22. The apparatus according to claim 17, wherein the first outlet is a central outlet.

23. The apparatus according to claim 17, further comprising:
    an electrode at an electric potential between the potential of the first outlet and the substrate and disposed between the first outlet and the substrate.

24. The apparatus according to claim 23, wherein the electrode is an annular electrode.

25. The apparatus according to claim 17, further comprising:
    a positioner for altering the relative position of the first outlet and the substrate.

26. The apparatus according to claim 17, where configured such that the chemical reaction, or the decomposition, or the chemical reaction and decomposition, occurs away from the substrate so as to provide the material as a powder.

27. The apparatus according to claim 17, where configured such that the chemical reaction, or the decomposition, or the chemical reaction and decomposition, occurs in the vicinity of the substrate so as to provide the material as a solid film.

28. An apparatus for depositing material on a substrate, comprising:
    a nozzle assembly including a first outlet from which a stream of droplets of a precursor liquid is in use delivered to a substrate, and a second outlet from which a flow of fuel is in use delivered such as to provide an annular flame combustion region through which at least a portion of the stream of droplets in use passes before reaching the substrate;
    a mesh disposed between the first outlet and the substrate;
    a precursor supply for supplying a precursor liquid to the nozzle assembly;
    an electrical supply for applying an electric field between the first outlet and the substrate; and
    a burner for generating the flame of the annular flame combustion region between the first outlet and the substrate;
    whereby the precursor liquid is chemically reacted, or decomposed, or chemically reacted and decomposed, in the annular flame combustion region to provide the deposited material.

* * * * *